United States Patent
Chang

(10) Patent No.: US 6,454,327 B1
(45) Date of Patent: Sep. 24, 2002

(54) WAFER BLADE EQUIPPED WITH EDGE BUMPER

(75) Inventor: Yi-Sen Chang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/916,474

(22) Filed: Jul. 27, 2001

(51) Int. Cl.[7] .................................................. B25J 15/00
(52) U.S. Cl. ........................ 294/1.1; 294/64.1; 414/941
(58) Field of Search ........................... 294/1.1, 32, 64.1, 294/64.2, 64.3; 414/935–941; 901/40, 49

(56) References Cited

U.S. PATENT DOCUMENTS 5,647,626 A * 7/1997 Chen et al. .................. 294/1.1
5,669,644 A * 9/1997 Kaihotsu et al. ............. 294/1.1
5,744,728 A * 4/1998 Suita ........................... 901/49
5,755,469 A * 5/1998 Choi et al. ................... 294/1.1

* cited by examiner

Primary Examiner—Dean J. Kramer
(74) Attorney, Agent, or Firm—Tung & Associates

(57) ABSTRACT

A wafer blade that is equipped with an impact-absorbing bumper along at least two sides, and preferably along all three side of the blade body except the side that is connected to a robot arm is described. A slot opening is formed in the periphery of the blade body for positioning of the impact-absorbing bumper which may be installed in the slot opening by either frictional engagement or adhesive. The impact-absorbing bumper on the wafer blade protects a wafer when the latter is accidentally collided with the wafer blade.

20 Claims, 3 Drawing Sheets

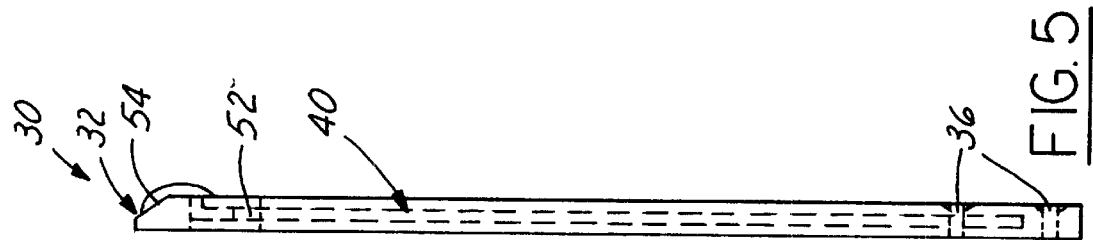
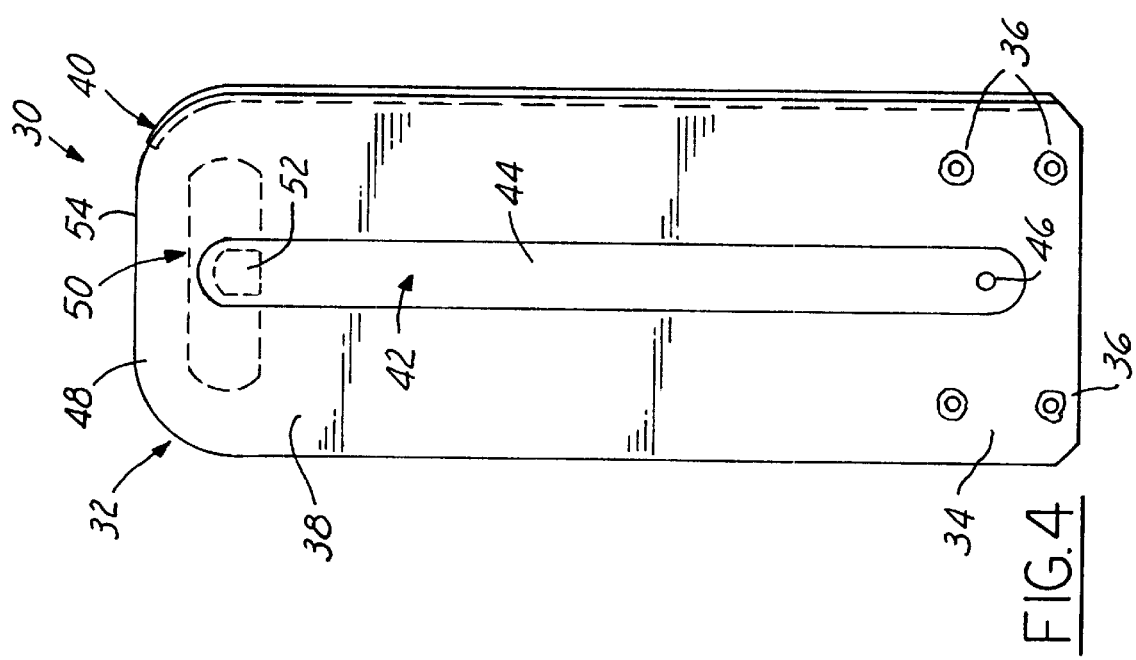
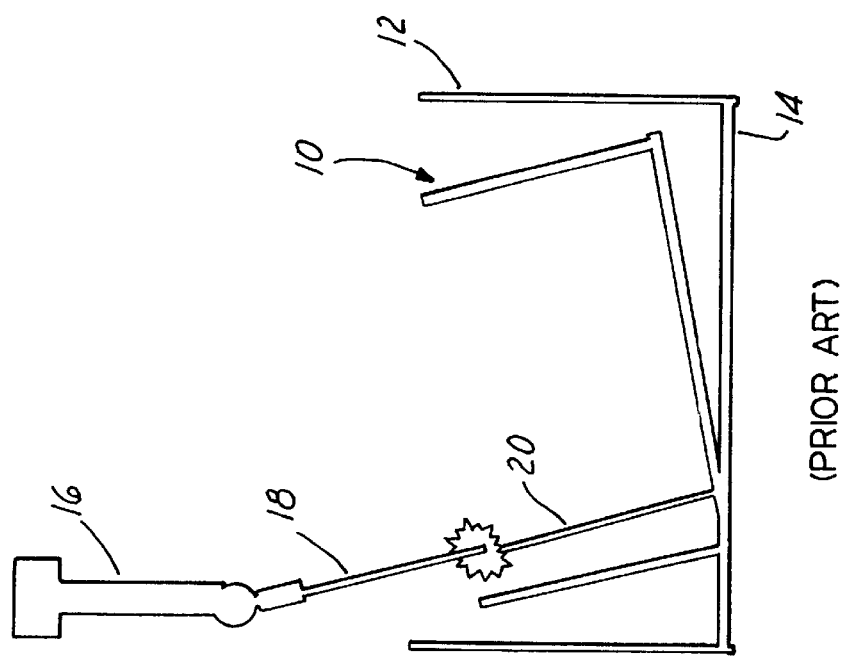

WAFER BLADE EQUIPPED WITH EDGE BUMPER

FIELD OF THE INVENTION

The present invention generally relates to a wafer blade for picking up wafers during semiconductor fabrication processes and more particularly, relates to a wafer blade that is equipped with an impact-absorbing bumper along at least two edges of the blade for picking up wafers during semiconductor fabrication processes.

BACKGROUND OF THE INVENTION

Apparatus for polishing thin, flat semi-conductor wafers is well known in the art. Such apparatus normally includes a polishing bead which carries a membrane for engaging and forcing a semi-conductor wafer against a wetted polishing surface, such as a polishing pad. Either the pad, or the polishing bead is rotated and oscillates the wafer over the polishing surface. The polishing bead is forced downwardly onto the polishing surface by a pressurized air system or, similar arrangement. The downward force pressing the polishing bead against the polishing surface can be adjusted as desired. The polishing bead is typically mounted on an elongated pivoting carrier arm, which can move the pressure bead between several operative positions. In one operative position, the carrier arm positions a wafer mounted on the pressure bead in contact with the polishing pad. In order to remove the wafer from contact with the polishing surface, the carrier arm is first pivoted upwardly to lift the pressure bead and wafer from the polishing surface. The carrier arm is then pivoted laterally to move the pressure bead and wafer carried by the pressure bead to an auxiliary wafer processing station. The auxiliary processing station may include, for example, a station for cleaning the wafer and/or polishing bead; a wafer unload station; or, a wafer load station.

More recently, chemical-mechanical polishing (CMP) apparatus has been employed in combination with a pneumatically actuated polishing bead. CMP apparatus is used primarily for polishing the front face or device side of a semiconductor wafer during the fabrication of semiconductor devices on the wafer. A wafer is "planarized" or smoothed one or more times during a fabrication process in order for the top surface of the wafer to be as flat as possible. A wafer is polished by being placed on a carrier and pressed face down onto a polishing pad covered with a slurry of colloidal silica or alumina in de-ionized water.

The CMP method can be used to provide a planner surface on dielectric layers, on deep and shallow trenches that are filled with polysilicon or oxide, and on various metal films. A possible mechanism for the CMP process involves the formation of a chemically altered layer at the surface of the material being polished. The layer is mechanically removed from the underlying bulk material. An outer layer is then regrown on the surface while the process is repeated again. For instance, in metal polishing, a metal oxide layer can be formed and removed repeatedly.

During a CMP process, a large volume of a slurry composition is dispensed. The slurry composition and the pressure applied between the wafer surface and the polishing pad determine the rate of polishing or material removal from the wafer surface. The chemistry of the slurry composition plays an important role in the polishing rate of the CMP process. For instance, when polishing oxide films, the rate of removal is twice as fast in a slurry that has a pH of 11 than with a slurry that has a pH of 7. The hardness of the polishing particles contained in the slurry composition should be about the same as the hardness of the film to be removed to avoid damaging the film. A slurry composition typically consists of an abrasive component, i.e, hard particles and components that chemically react with the surface of the substrate. For instance, a typical oxide polishing slurry composition consists of a colloidal suspension of oxide particles with an average size of 30 nm suspended in an alkali solution at a pH larger than 10. A polishing rate of about 120 nm/min can be achieved by using this slurry composition. Other abrasive components such as ceria suspensions may also be used for glass polishing where large amounts of silicon oxide must be removed. Ceria suspensions act as both the mechanical and the chemical agent in the slurry for achieving high polishing rates, i.e, larger than 500 nm/min. While ceria particles in the slurry composition remove silicon oxide at a higher rate than do silica, silica is still preferred because smoother surfaces can be produced. Other abrasive components, such as alumina ($Al_3O_2$) may also be used in the slurry composition.

When a wafer surface is planarized by a CMP process, the wafer may have to be transferred between various CMP process stations before the planarization can be completed. During the transfer of the wafer between various CMP stations, the wafers are stored in a wafer storage cassette in a vertical position and the whole cassette is then positioned in a water tank such that the wafers are immersed in water to prevent the slurry solution left on the wafer surface from drying or solidifying. This is an important process step since if the wafers are not stored immersed in water, the solidified particles on the wafer surface becomes a contaminated source and may cause serious scratching of the wafer surface during the subsequent CMP operation.

A cassette tub is normally used for holding at least one wafer cassette, i.e. holding four wafer cassettes, in a tilted position for accessing by a robot blade, as shown in FIGS. 1, 2 and 3. A wafer cassette 10 is positioned in a cassette tub 12 at a tilt angle of about 5.5° as measured from the horizontal plane, i.e. the bottom wall 14 of the tub. A robot 16 operating a robot blade 18 is used to pick-up wafers 20 that are stored in the wafer cassette 10. The wafers 20 are positioned in slots (not shown) formed on the interior sidewall of the wafer cassette 10. For instance, the robot blade 18, shown in FIG. 2, is in a pick-up position when the robot lowers the blade.

In a conventional chemical mechanical polishing apparatus, a cassette tub pin is used to fix the wafer cassette position inside the tub. The original design by the machine manufacturer is only one single pin for inserting into a cassette tub hole. The single pin is designed to hold the wafer cassette in position during the robot pick-up process of the wafer from the cassette. However, the cassette tub pin can easily fall off from the cassette tub hole and thus cause the wafer cassette position to shift away from its supposed position, i.e. at a 5.5° angle. When this happens, the robot blade 18, when lowered to pick-up a wafer, as shown in FIG. 3, may collide with the wafer 20 and thus either damages the wafer or causes wafer breakage and thus the wafer becomes scrape. It is therefore important in the robot blade pick-up process that the blade does not damage the wafer when the blade accidentally touches or strikes the wafer due to either a mispositioning of the wafer cassette 10 or a misalignment of the robot blade 18.

It is therefore an object of the present invention to provide a wafer blade for picking up wafers during a semiconductor fabrication process that does not have the drawbacks or shortcomings of the conventional wafer blades.

It is another object of the present invention to provide a wafer blade that is equipped with an impact-absorbing bumper along at least two edges of the blade.

It is a further object of the present invention to provide a wafer blade that is equipped with an impact-absorbing bumper along at least two edges of the blade for protecting a wafer that the blade accidentally touches.

It is another further object of the present invention to provide a wafer blade that is equipped with an elastomeric bumper positioned along a periphery of the blade for protecting wafers that the blade accidentally touches.

It is still another object of the present invention to provide a wafer blade that is equipped with an elastomeric O-ring around a periphery of the blade for protecting wafers that the blade accidentally touches.

It is yet another object of the present invention to provide a wafer blade that has an impact-absorbing bumper glued onto a periphery of the blade for protecting wafers that the blade acciddentally touches.

SUMMARY OF THE INVENTION

The present invention discloses a wafer blade that is equipped with an impact-absorbing bumper fabricated of an elastomeric material along at least two edges of the blade for protecting wafers that the blade accidentally touches.

In a preferred embodiment, a wafer blade that is equipped with an impact-absorbing bumper installed along at least two sides of the blade is provided which includes a blade body of generally elongated rectangular shape that has a first thickness; a slot opening formed in a periphery of the blade body that has a second thickness, the second thickness is smaller than the first thickness; and an impact-absorbing bead situated in the slot opening along at least two sides of the blade body for preventing damages to a wafer when struck by the wafer blade.

In the wafer blade that is equipped with an impact-absorbing bumper along at least two edges of the blade, the first thickness is not less than 1.8 mm and the second thickness is not more than 1.4 mm. The slot opening may have a rectangular cross-section, while the impact-absorbing bead may be formed of an elastomeric material. The impact-absorbing bead may be formed of an elastomeric material selected from the group consisting of nitrile rubber, EPDM rubber, flouroelastomers, silicone rubber, neoprene rubber and styrene-butadiene rubber. The impact-absorbing bead may be a rubber O-ring, and may be situated in the slot opening by frictional engagement, or may be bonded to the slot opening by adhesive means. The blade body may be fabricated of a rigid metal. The impact-absorbing bead may be situated in the slot opening along all sides of the blade body except the side that is connected to a robot arm.

The present invention is further directed to a wafer blade that is equipped with an elastomeric O-ring along at least two edges of the blade that includes a blade body of elongated rectangular shape that has a front side, a left side, a right side and a back side, the back side is adapted for connecting to a robot arm; a slot opening formed in a periphery of the blade body along the front side, the right side and the left side; and an elastomeric O-ring situated in the slot opening along at least two of the front side, the left side and the right side for preventing damages to wafers that the blade body touches.

In the wafer blade that is equipped with an elastomeric O-ring along at least two edges of the blade, the O-ring may be installed in the slot opening along the front side, the left side and the right side. The blade body may have a thickness of at least 1.8 mm and the slot opening may have a thickness of not more than 1.4 mm. The slot opening may have a rectangular cross-section. The elastomeric O-ring may be formed of a material selected from the group consisting of nitrile rubber, EPDM rubber, flouroelastomers, silicone rubber, neoprene rubber and styren-butadiene rubber. The elastomeric O-ring may be positioned in a slot opening by frictional engagement, or may be bonded to the slot opening by adhesive means.

The present invention is still further directed to a wafer blade that is equipped with a rubber O-ring along a periphery of the blade that includes a blade body of elongated rectangular shape that has a front side, a left side, a right side and a back side. The back side is adapted for connecting to a robot arm; a slot opening formed in a periphery of the blade body along the front side, the right side and the left side; and a rubber O-ring situated in the slot opening along the front side, the left side and the right side for preventing damages to wafers when struck by the blade body. The rubber O-ring may be installed along a periphery of the blade by glueing to the slot opening, or by engaging the slot opening by frictional engagement.

BRIEF DESCRIPTION OF THE DRAWINGS

These and other objects, features and advantages of the present invention will become apparent from the following detailed description and the appended drawings in which:

FIG. 3 is a cross-sectional view of the conventional cassette tub of FIG. 1 with a wafer cassette mounted therein illustrating a wafer blade colliding with a wafer.

FIG. 4 is a plain view of the back side of the present invention wafer blade with an impact-absorbing bumper installed on one side.

FIG. 5 is a side view of the present invention wafer blade of FIG. 4 showing a tapered front section of the blade.

DETAILED DESCRIPTION OF THE PREFERRED EMBODIMENT

Figure 1:
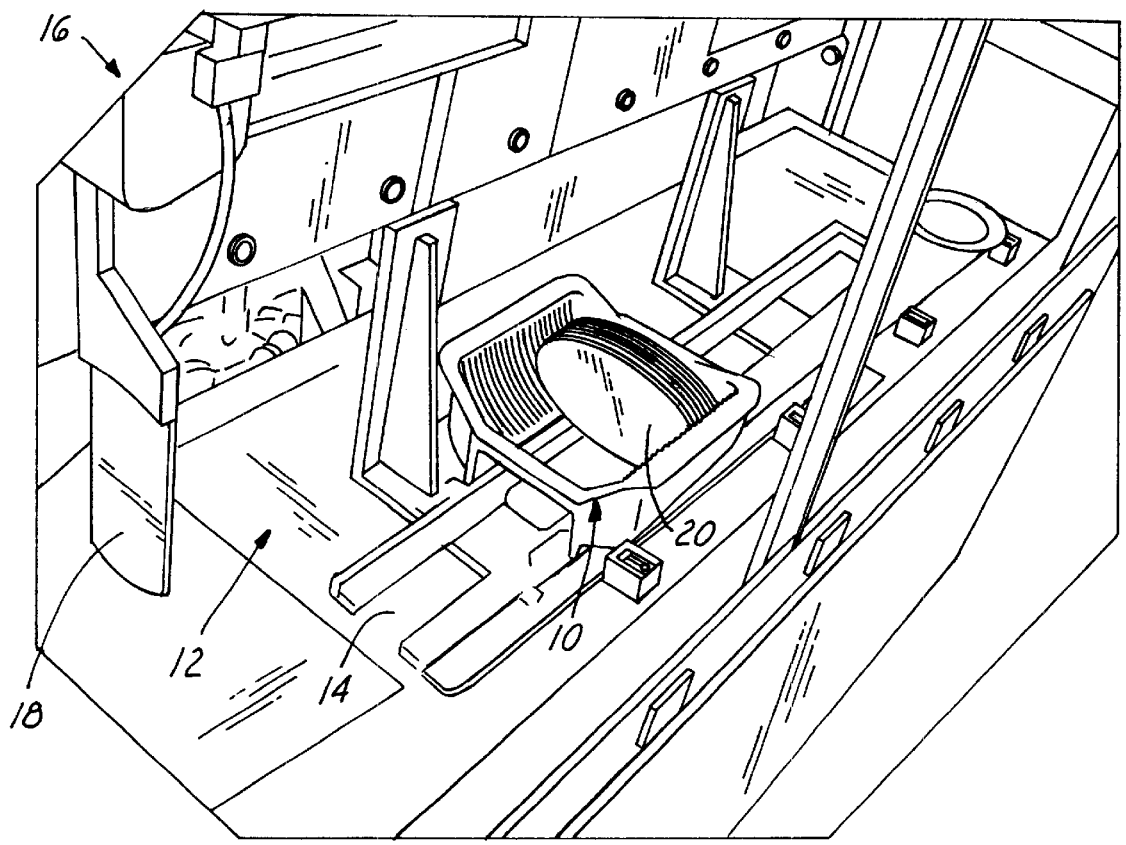
FIG. 1 is a prospective view of a conventional cassette tub for a CMP apparatus holding a wafer cassette therein.
Figure 2:
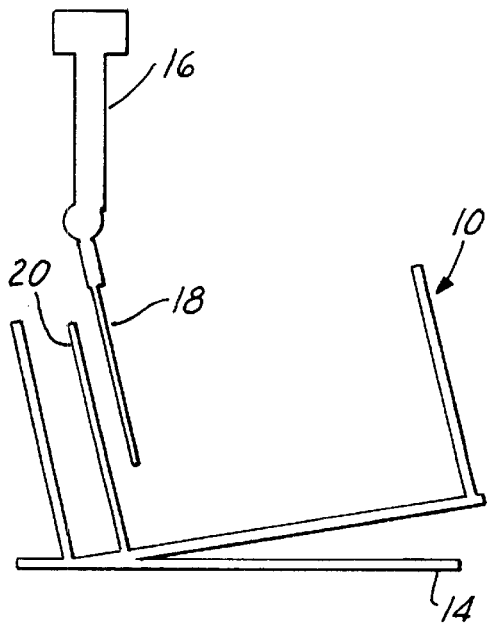
FIG. 2 is a cross-sectional view of the conventional cassette tub of FIG. 1 wherein a wafer blade is positioned to pick up a wafer from the cassette.

The present invention discloses a wafer blade that is equipped with an impact-absorbing bumper along at least two sides of the blade, and preferably along all three sides of the blade except the side that is connected to a robot arm.

The wafer blade is generally constructed of a blade body of elongated rectangular shape that has a first thickness, such as between about 1.5 mm and about 3 mm, and preferably of about 2 mm. The word "about" used in this writing indicates a range of values that is ±10% of the average value given. A slot opening is formed on the side of the blade body along the periphery of the body to a second thickness. The second thickness is smaller than the first thickness. For instance, the second thickness is between about 1.0 mm and about 1.6 mm, and preferably at about 1.4 mm. An impact-absorbing bead, such as a bead formed of an elastomeric material, is positioned in the slot opening along at least two sides, and preferably along all three sides of the blade body except the side for connecting to a robot arm. The impact-absorbing bead may be suitably a rubber O-ring that is positioned in the slot opening by either frictional engagement or by adhesive bonding. The impact-absorbing bead, or the impact-absorbing bumper effectively prevents damage to a wafer when the wafer blade accidentally collides with the wafer.

The slot opening formed in the side of the blade body may have a rectangular cross-sectional area to facilitate the insertion by frictional engagement of a rubber O-ring that has a circular cross-section. The rubber O-ring or the impact-absorbing bumper may be formed of an elastomeric material, such as one selected from nitrile rubber, EPDM rubber, flouroelastomers, silicone rubber, neophrene rubber, styrene-butadiene rubber, or other suitable rubber material. The impact-absorbing bumper may further be assembled to the wafer blade by bonding to the slot opening by an adhesive. The blade body of the wafer blade is normally fabricated of a rigid metal material, such as stainless steel or aluminum.

Referring now to FIG. 4 wherein a present invention wafer blade 30 that is equipped with at least one impact-absorbing bumper 40 is shown. The wafer blade 30 is constructed of a blade body 32 of generally elongated rectangular shape and formed of a rigid metal such as stainless steel or aluminum. At a base portion 34 of the blade body 32, is provided mounting means 36, which are screw holes for attaching to a robot arm (not shown). FIG. 4 shows the backside surface 38 of the blade body 32 which further contains a vacuum passageway 42 which is a channel formed in the blade body 32 and sealed by a cover 44. At the base portion 34 of the blade body 32, the vacuum passageway 42 is in fluid communication with an external vacuum source (not shown) through a vacuum inlet 46. At the front portion 48 of the blade body 32, the vacuum passageway 42 is in fluid communication with a recessed vacuum port 50 through a vacuum opening 52.

The impact-absorbing bumper 40 is further shown in a side view of the wafer body 32 in FIG. 5. It is seen that a tapered tip section 54 is formed at the front portion 48 of the blade body 32

Figure 6:
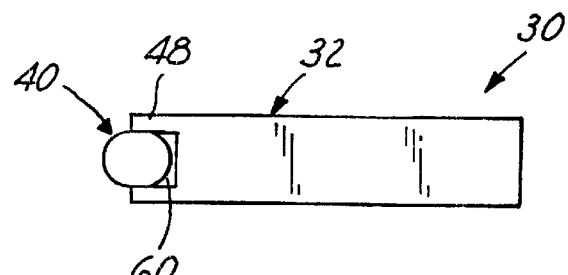
FIG. 6 is an end view of the present invention wafer blade of FIG. 4 illustrating the positioning of the impact-absorbing bumper in a slot opening in the blade.

The mounting of the impact-absorbing bumper 40 in the blade body 32 can be better seen in an end view of FIG. 6. It is seen that the impact-absorbing bumper 40, having a circular cross-section, is positioned in the slot opening 60 of a rectangular shape by frictional engagement. This is possible when a rubber O-ring is used as the impact-absorbing bumper that has sufficient elasticity for insertion into the slot opening 60. The rubber material used in the rubber O-ring should be chemical resistant and does not swell in water after extended exposure to such environment. The slot opening 60 may also be formed in any other suitable shape or cross-section, as long as the mounting of the impact-absorbing bumper 40 is possible. For instance, the impact-absorbing bumper may be assembled to the blade body 32 by adhesive means when an adhesive material is first applied into the base of the slot opening 60 prior to the installation of the impact-absorbing bumper.

Figure 7:
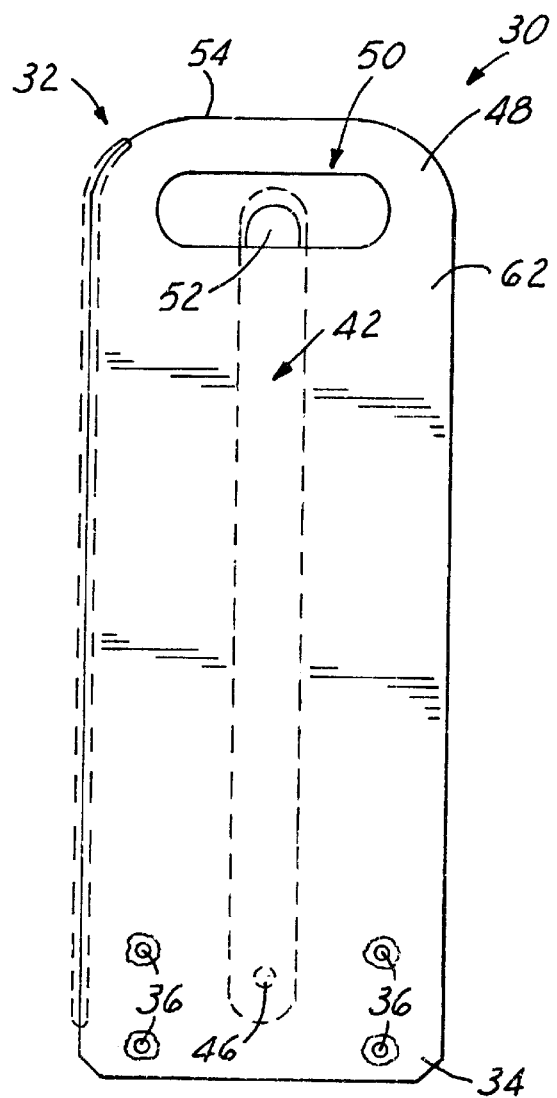
FIG. 7 is a plain view of the wafer pick-up side of the present invention wafer blade of FIG. 4.

FIG. 7 is a plain view of the front side 62, or the wafer pick-up side, of the blade body 32. It should be noted that, for simplicity reason, only one impact-absorbing bumper 40 is shown in FIGS. 4~7. Preferably at least two sides of the blade body 32 should be covered by the impact-absorbing bumper, and more preferably, all three sides of the left side, the right side and the right side should be covered by the impact-absorbing bumper.

The present invention wafer blade that is equipped with an impact-absorbing bumper along at least two sides of the blade body has therefore been amply described in the above description and in the appended drawings of FIGS. 4~7.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A wafer blade equipped with an impact-absorbing bumper along at least two edges of the blade comprising:
   a blade body of generally elongated rectangular shape having a first thickness;
   a slot opening formed in a periphery of said blade body having a second thickness, said second thickness being smaller than said first thickness; and
   an impact-absorbing bead situated in said slot opening along at least two sides of said blade body for preventing damages to a wafer when struck by a wafer blade.

2. A wafer blade equipped with an impact-absorbing bumper along at least two edges of the blade according to claim 1, wherein said first thickness is not less than 1.8 mm and said second thickness is not more than 1.4 mm.

3. A wafer blade equipped with an impact-absorbing bumper along at least two edges of the blade according to claim 1, wherein said slot opening has a rectangular cross-section.

4. A wafer blade equipped with an impact-absorbing bumper along at least two edges of the blade according to claim 1, wherein said impact-absorbing bead is formed of an elastomeric material.

5. A wafer blade equipped with an impact-absorbing bumper along at least two edges of the blade according to claim 1, wherein said impact-absorbing bead is formed of an elastomer selected from the group consisting of nitrile rubber, EPDM ruber, fluoroelastomers, silicone rubber, neoprene rubber and styrene-butadiene rubber.

6. A wafer blade equipped with an impact-absorbing bumper along at least two edges of the blade according to claim 1, wherein said impact-absorbing bead is a rubber O-ring.

7. A wafer blade equipped with an impact-absorbing bumper along at least two edges of the blade according to claim 1, wherein said impact-absorbing bead is situated in said slot opening by frictional engagement.

8. A wafer blade equipped with an impact-absorbing bumper along at least two edges of the blade according to claim 1, wherein said impact-absorbing bead is bonded to said slot opening by adhesive means.

9. A wafer blade equipped with an impact-absorbing bumper along at least two edges of the blade according to claim 1, wherein said blade body is fabricated of a rigid metal.

10. A wafer blade equipped with an impact-absorbing bumper along at least two edges of the blade according to claim 1, wherein said impact-absorbing bead is situated in said slot opening along all sides of the blade body except the side that is connected to a robot arm.

11. A wafer blade equipped elastomeric O-ring along at least two edges of the blade comprising:
   a blade body of elongated rectangular shape having a front side, a left side, a right side and a back side, said back side being adapted for connecting to a robot arm;
   a slot opening formed in a periphery of said blade body along said front side, said right side and said left side; and an elastomeric O-ring situated in said slot opening along at least two of said front side, said left side and said right side for preventing damages to wafers that the blade body touches.

12. A wafer blade equipped with an elastomeric O-ring along at least two edges of the blade according to claim 11, wherein said O-ring being situated in said slot opening along the front side, the left side and the right side.

13. A wafer blade equipped with an elastomeric O-ring along at least two edges of the blade according to claim 11, wherein said blade body has a thickness of at least 1.8 mm and said slot opening has a thickness of not more than 1.4 mm.

14. A wafer blade equipped with an elastomeric O-ring along at least two edges of the blade according to claim 11, wherein said slot opening has a rectangular cross-section.

15. A wafer blade equipped with an elastomeric O-ring along at least two edges of the blade according to claim 11, wherein said elastomeric O-ring being formed of a material selected from the group consisting of nitrile rubber, EPDM ruber, fluoroelastomers, silicone rubber, neoprene rubber and styrene-butadiene rubber.

16. A wafer blade equipped with an elastomeric O-ring along at least two edges of the blade according to claim 11, wherein said elastomeric O-ring is positioned in said slot opening by frictional engagement.

17. A wafer blade equipped with an elastomeric O-ring along at least two edges of the blade according to claim 11, wherein said elastomeric O-ring is bonded to said slot opening by adhesive means.

18. A wafer blade equipped with an elastomeric O-ring along at least two edges of the blade according to claim 11, wherein said blade body is fabricated of a rigid metal.

19. A wafer blade equipped with a rubber O-ring along a periphery of the blade comprising:

a blade body of elongated rectangular shape having a front side, a left, side, a right side and a back side, said back side being adapted for connecting to a robot arm;

a slot opening formed in a periphery of said blade body along said front side, said right side and said left side; and a rubber O-ring situated in said slot opening along said front side, said left side and said right side for preventing damages to wafers that the blade body touches.

20. A wafer blade equipped with a rubber O-ring along a periphery of the blade according to claim 19, wherein said rubber O-ring is glued to said slot opening.

* * * * *